US009159482B2

(12) United States Patent
Green et al.

(10) Patent No.: US 9,159,482 B2
(45) Date of Patent: Oct. 13, 2015

(54) RUPTURE RESISTANT TANK SYSTEM

(75) Inventors: Michael S. Green, Bossier City, LA (US); Paul A. Siemers, Clifton Park, NY (US); Malcolm G. Smith, Jr., Shreveport, LA (US); Florian P. Pintgen, South Pasadena, CA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/643,214

(22) Filed: Dec. 21, 2009

(65) Prior Publication Data

US 2010/0133284 A1 Jun. 3, 2010

Related U.S. Application Data

(63) Continuation-in-part of application No. 12/212,050, filed on Sep. 17, 2008, now Pat. No. 8,710,946, and a continuation-in-part of application No. 12/212,062, filed on Sep. 17, 2008, now Pat. No. 8,717,134.

(51) Int. Cl.

| | |
|---|---|
| ***H01F 27/02*** | (2006.01) |
| ***H01F 27/08*** | (2006.01) |
| ***H01F 27/10*** | (2006.01) |
| ***H05K 5/00*** | (2006.01) |
| ***H05K 7/20*** | (2006.01) |
| ***H01B 3/24*** | (2006.01) |
| ***H01F 27/14*** | (2006.01) |

(52) U.S. Cl.
CPC ................ *H01F 27/02* (2013.01); *H01F 27/14* (2013.01)

(58) Field of Classification Search
USPC ........ 336/90, 55, 57, 58, 61, 92, 94; 220/721; 174/17 VA, 17 LF; 252/570
See application file for complete search history.

(56) References Cited

U.S. PATENT DOCUMENTS

| | | | | |
|---|---|---|---|---|
| 1,620,411 A | | 3/1927 | Temple | |
| 1,641,247 A | | 9/1927 | Bingay | |
| 1,780,319 A | * | 11/1930 | Sonneborn | 165/104.33 |
| 2,142,366 A | * | 1/1939 | Mitschrich | 336/92 |
| 2,479,373 A | * | 8/1949 | Knotts et al. | 336/57 |

(Continued)

FOREIGN PATENT DOCUMENTS

| | | |
|---|---|---|
| CN | 2217259 Y | 1/1996 |
| DE | 1 971 624 U | 11/1967 |

(Continued)

OTHER PUBLICATIONS

English Translation of DE1971624U1, Gatterbauer, Nov. 2, 1967.*

(Continued)

*Primary Examiner* — Elvin Enad
(74) *Attorney, Agent, or Firm* — Parks Wood LLC

(57) ABSTRACT

A rupture resistant system is provided and comprises a tank comprising a top member, a combined body member, the combined body member forming a side and bottom of the tank, the combined body member comprising at least one curved non-linear surface to define a partially curved interior in at least a portion of the tank; and a component situated within the tank and susceptible to creating increasing pressure within the tank when under a fault condition. At least one of the top, sidewall, and bottom members is connected to another of the top, sidewall, and bottom members in a manner so as to cause an increase in inner volume of the tank under increased pressure conditions.

19 Claims, 10 Drawing Sheets

(56) References Cited

U.S. PATENT DOCUMENTS

| | | | | |
|---|---|---|---|---|
| 2,773,146 | A | 12/1956 | Sauer | |
| 2,961,476 | A | 11/1960 | Maslin et al. | |
| 3,073,885 | A * | 1/1963 | Guglielmo | 174/15.1 |
| 3,474,369 | A * | 10/1969 | Keogh | 336/65 |
| 3,545,538 | A * | 12/1970 | Wilson et al. | 165/175 |
| 3,626,080 | A * | 12/1971 | Pierce | 174/15.1 |
| 3,644,858 | A * | 2/1972 | Galloway | 336/92 |
| 3,921,112 | A * | 11/1975 | Broverman | 336/58 |
| 4,117,525 | A * | 9/1978 | Moore | 361/37 |
| 4,453,197 | A | 6/1984 | Burrage | |
| 4,745,966 | A * | 5/1988 | Avery | 165/104.33 |
| 4,939,833 | A * | 7/1990 | Thomas | 220/565 |
| 6,726,857 | B2 | 4/2004 | Goedde et al. | |
| 6,804,092 | B1 | 10/2004 | Magnier | |
| 2006/0201799 | A1 * | 9/2006 | Carrasco-Aguirre | 204/279 |
| 2007/0001793 | A1 | 1/2007 | Magnier | |

FOREIGN PATENT DOCUMENTS

| | | | |
|---|---|---|---|
| DE | 1971624 | U1 | 11/1967 |
| GB | 688952 | A | 3/1953 |
| JP | 0061618 | C | 1/1924 |
| JP | 37-022923 | Y | 8/1962 |
| JP | 37-022924 | Y | 8/1962 |
| JP | 39-026864 | B | 11/1964 |
| JP | 59-000629 | Y2 | 12/1980 |
| JP | 57007909 | A1 | 1/1982 |
| JP | 57007911 | A1 | 1/1982 |
| JP | 59104108 | A * | 6/1984 |
| JP | 59104108 | A1 | 6/1984 |
| JP | H05211107 | A | 8/1993 |

OTHER PUBLICATIONS

Search report issued in connection with EP Application No. 09169978.5. May 2, 2013.

Office Action received from the USPTO regarding U.S. Appl. No. 12/212,050.

Office action issued in connection with CN patent application No. 200910175632.0, Apr. 23, 2013.

* cited by examiner

RUPTURE RESISTANT TANK SYSTEM

CROSS REFERENCE TO RELATED APPLICATIONS

This application is a continuation-in part of U.S. patent application Ser. No. 12/212,050, entitled "Rupture Resistant System", filed on Sep. 17, 2008 now U.S. Pat. No. 8,710,946, and U.S. patent application Ser. No. 12/212,062, entitled "System with Directional Pressure Venting", also filed on Sep. 17, 2008 now U.S. Pat. No. 8,717,134, which are herein incorporated by reference.

BACKGROUND OF THE INVENTION

The subject matter disclosed herein relates generally to transformers, and, more particularly, to a rupture resistant system for transformers that is capable of creating additional volume under increased pressure conditions to mitigate hazards.

The subject matter disclosed herein also relates generally to transformers, and, more particularly, to a containment system for transformers that provides safer pressure relief under excessive pressure conditions.

Transformer failures result in sudden generation of gases, which increase the pressure inside the transformer tank. Catastrophic rupture of a transformer can occur when the pressure generated by the gases exceeds the transformer's rupture pressure. Such ruptures may result in releasing gases and liquids, which can pose a hazard to the surroundings and pollute the environment.

BRIEF DESCRIPTION OF THE INVENTION

In various embodiments disclosed herein, gas containment capabilities are improved by creating volume in the transformer, increasing the rupture pressure of the transformer, or combinations thereof.

More specifically, in accordance with one embodiment disclosed herein, a rupture resistant system is provided and comprises a tank comprising a top member, a combined body member, the combined body member forming a side and bottom of the tank, the combined body member comprising at least one curved non-linear surface to define a partially curved interior in at least a portion of the tank; and a component situated within the tank and susceptible to creating increasing pressure within the tank when under a fault condition. At least one of the top, sidewall, and bottom members is connected to another of the top, sidewall, and bottom members in a manner so as to cause an increase in inner volume of the tank under increased pressure conditions.

More specifically, in accordance with one embodiment disclosed herein, a system comprises a tank, a radiator connected to the tank, and a component situated within the tank and susceptible to causing a pressure increase in the system when under a fault condition. The radiator is configured to directionally vent gases and liquids under excessive pressure conditions.

In accordance with another embodiment disclosed herein, a transformer system comprises a transformer, a transformer tank housing the transformer, a radiator configured to directionally vent gases and liquids under excessive pressure conditions, and a header pipe connecting the radiator and the transformer tank.

In accordance with another embodiment disclosed herein, a rupture resistant system comprises a tank, a radiator, a header pipe connecting the tank to the radiator, and a component situated within the tank and susceptible to creating increasing pressure within system when under a fault condition. The radiator is configured to increase an inner volume under increased pressure conditions.

In accordance with another embodiment disclosed herein, a transformer system comprises a transformer tank housing a transformer, a radiator, and a header pipe connecting the radiator and the transformer tank. The transformer tank comprises a top member, a sidewall member, and a bottom member, which are connected so as to enable increase in inner volume of the transformer tank under increased pressure conditions. The radiator is also configured to increase an inner volume under increased pressure conditions.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Embodiments disclosed herein include rupture resistant systems. In one embodiment, a rupture resistant system comprises a tank comprising a top member, a sidewall member, and a bottom member and a component situated within the tank and susceptible to creating increasing pressure within the tank when under a fault condition. At least one of the top, sidewall, and bottom members is connected to another of the top, sidewall, and bottom members in a manner so as to cause an increase in inner volume of the tank under increased pressure conditions. In another embodiment, a rupture resistant system comprises a tank, a radiator, and a header pipe connecting the tank to the radiator. The radiator is configured to increase an inner volume under increased pressure conditions. In still another embodiment, the above two embodiments are combined. More specific aspects of these embodiments are described below for purposes of example. Although transformer embodiments are described for purposes of example, the embodiments described herein are useful for systems wherein undesired pressures may occur in a tank and/or radiator.

As used herein, singular forms such as "a," "an," and "the" include single and plural referents unless the context clearly dictates otherwise. For example, although a plurality of sidewall members are typically used, in some embodiments, a single side member may be used. Furthermore, the members need not be discrete such that, in some embodiments, a common sheet may be bent to serve as multiple members. The sheet may comprise materials such as, for example, steel, metal alloys, aluminum, and corrosion resistant materials such as polymers and thermoplastics.

Figure 1:
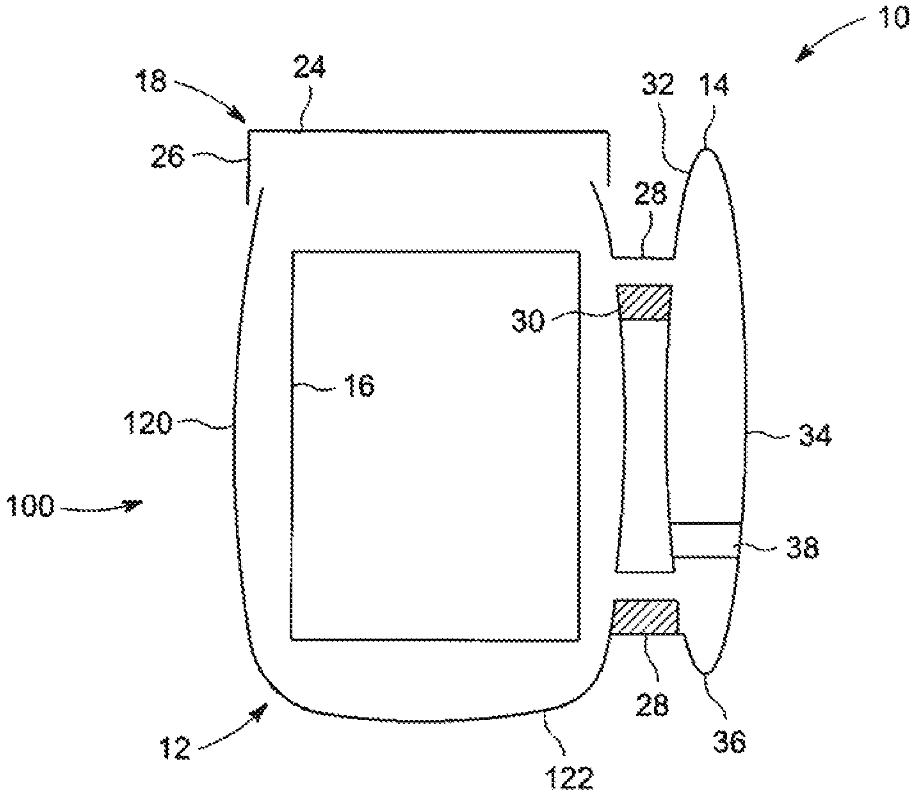
FIG. 1 illustrates an embodiment of a transformer system, as embodied by the invention, under normal operating conditions in accordance with aspects disclosed herein.

FIG. 1 illustrates an embodiment of a rupture resistant system 10 comprising a tank 12, a radiator 14, and a component 16 situated within tank 12. Component 16 is susceptible to creating increasing pressure within tank 12 when under a fault condition. In one embodiment, component 16 comprises a transformer coil and core assembly with accessories, and the tank comprises a transformer tank.

Figure 4:
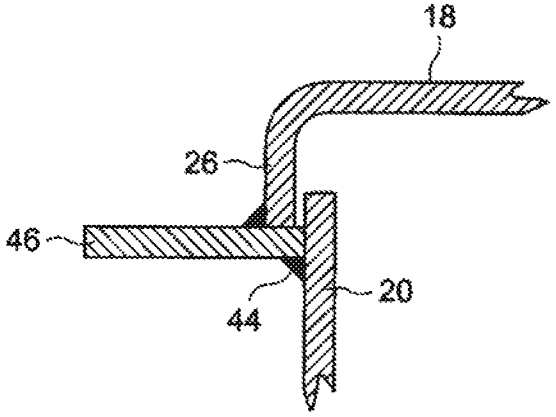
FIG. 4 illustrates an embodiment of a connection between a top member and a sidewall member in accordance with aspects disclosed herein.

Tank 12, as embodied by the invention, comprises a top member 18 and a combined body member 100. The combined body member 100 comprises a side and 120 and a bottom 122 of the combined body member 100. In one embodiment, top member 18 comprises a curved member having a top plate 24 and surfaces 26 extending perpendicularly from the top plate and over a portion of side 120, and top member 18 and side 120 can be coupled by a joint comprising a flange extending from the sidewalls and at least one weld (FIG. 4). Top member 18, bottom 122, or both, as embodied by the invention, may be connected to side 120 using joints designed to facilitate top member 18 and side 120 to flex outward to increase inner volume of tank 12 while remaining connected under increased pressure conditions.

As illustrated in FIG. 1, the combined body member 100 comprises at least one curved non-linear surface to define a partially curved interior in at least a portion of the tank. In the illustrated exemplary embodiment of FIG. 1, the combined body member 100 can comprise at least one curved non-linear surface at 120, or 122 to define a partially curved interior in at least a portion of the tank. This configuration can provide enhanced structural integrity of the combined body member 100, for example, but not limited to, lessening the number of joints, stress zones, or the like where the combined body member 100 may not be as strong as in other places of the combined body member 100.

Radiator 14 may be connected to tank 12 by header pipes 28, as embodied by the invention. Header pipes 28 have passages or diameters that are larger than conventional header pipe diameters and are sized to permit sufficient flow of gas from the transformer tank to the radiator under increased pressure conditions. Under normal operating conditions, increased header pipe diameters may reduce thermal performance. In one embodiment, header pipes 28 are provided with flow restrictors 30 to control flow from tank 12 to radiator 14.

As illustrated in FIG. 1. the radiator 14 can comprise at least one curved non-linear surface to define a partially curved interior in the radiator 14. As discussed above, this configuration can provide enhanced structural integrity of the radiator 14, for example, but not limited to, lessening the number of joints, stress zones, or the like where the radiator 14 may not be as strong as in other places of the radiator 14.

Flow restrictors 30, as embodied by the invention, are configured to be displaced under increased pressure conditions to increase flow from tank 12 to radiator 14. In one example, the header pipes 28 have diameters ranging from about six inches to about ten inches and having cross sections of about four inches when flow restrictors 30 are in place to control flow. In another embodiment, the sum of the cross-sectional areas of the header pipes 28 is adjusted by additionally or alternatively adjusting a number of header pipes 28. Flow restrictors 30 may optionally be used in this embodiment as well.

Radiator 14 comprises an inner panel 32 and an outer panel 34 connected to the inner panel with inner panel 32 being coupled to header pipes 28. The inner panel 32 and an outer panel 34 may be curved with respective joints 36 to define a non-polygonal radiator 14, or alternatively the inner panel 32 and an outer panel 34 may form a polygonal radiator 14.

Inner panel 32 and outer panel 34 are designed to flex outward to increase inner volume of radiator 14 under increased pressure conditions. In one embodiment, inner panel 32 and outer panel 34 are connected by a circumferential joint 36 that is strong enough to retain connection between the inner and outer panel when the inner panel 32 and the outer panel 34 flex outward. The circumferential joint 36 comprises a joint connecting the peripheries of the inner and outer panels. Spacers 38 may be attached between the inner and outer panels to maintain inner panel 32 and outer panel 34 in a spaced apart relationship.

Figure 2:
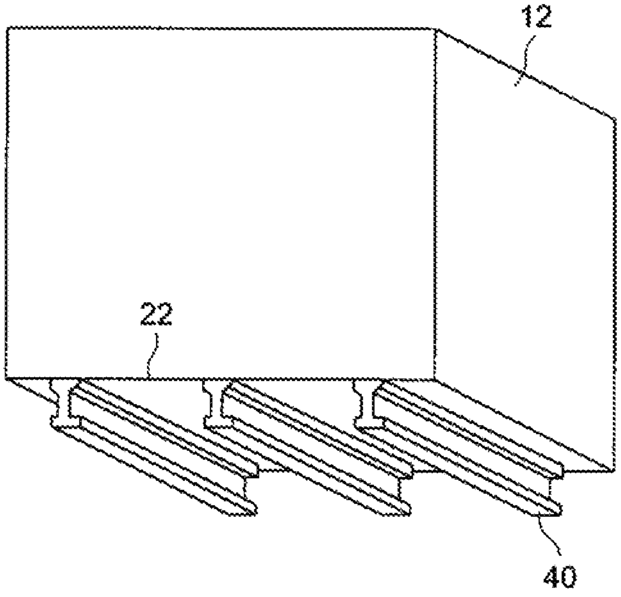
FIG. 2 illustrates an embodiment with an I-beam, as embodied by the invention, for providing additional strength to a transformer tank in accordance with aspects disclosed herein.

FIG. 2 illustrates an embodiment for providing additional strength to tank 12, as embodied by the invention. Typically, the bottom of a transformer tank is provided with at least two I-beams 40 for support. Tank 12 in this embodiment is provided with an additional I-beam 40 in the middle of bottom member 122. The use of additional I-beam 40 reduces bending of bottom member 122 under increased pressure conditions. In another embodiment (not shown), at least one I-beam is coupled diagonally under the bottom member.

Figure 3:
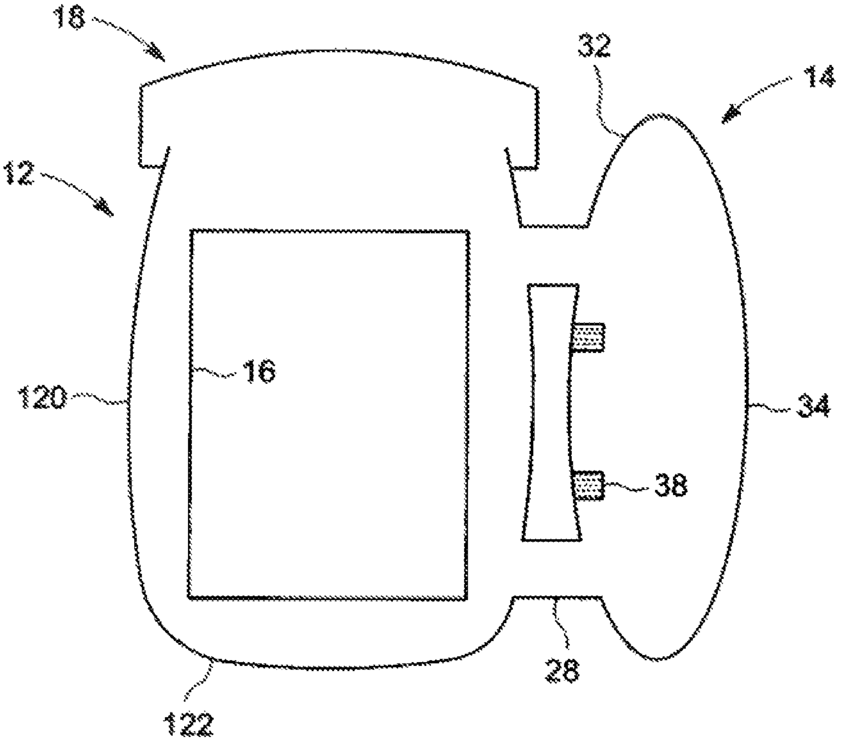
FIG. 3 illustrates an embodiment of the transformer system of FIG. 1 under increased pressure conditions in accordance with aspects disclosed herein.

FIG. 3 illustrates the rupture resistant system under increased pressure conditions, with the at least one curved. non-linear surface expanded. Top member 18 and side 120 flex outward to create additional volume under increased pressure conditions. Similarly, inner panel 32 and outer panel 34 of radiator 14 also flex outward to create additional volume. The flow restrictors (not shown) are displaced from header pipes 28. As inner panel 32 and outer panel 34 flex outward, spacers 38 are detached from one of the panels (shown as outer panel 34 in FIG. 3). The additional volume thus created increases the amount of gas that the tank 12 and radiator 14 can withstand without rupturing.

FIG. 4 illustrates an embodiment of a connection between top member 18 and sidewall member 120. A flange 42 is welded to an upper portion of an outer surface of sidewall member 120 with a weld 44. The extending surface 26 of top member 18 is welded to the free end of flange 42.

Figure 5:
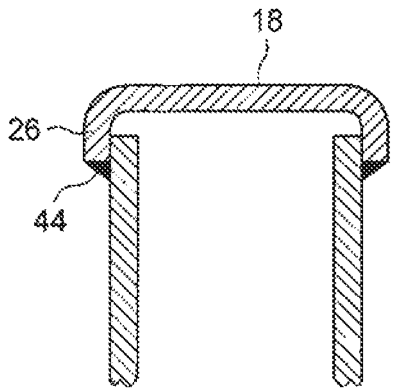
FIG. 5 illustrates another embodiment of a connection between a top member and a sidewall member in accordance with aspects disclosed herein.

FIG. 5 illustrates another embodiment of a connection between top member 18 and sidewall member 120. In this embodiment, the extending surface 26 of top member 18 is welded to the outer surface of the sidewall member 120 with a weld 44.

Figure 6:
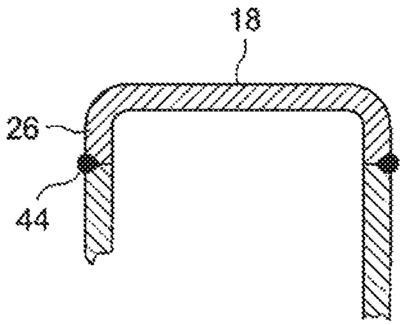
FIG. 6 illustrates another embodiment of a connection between a top member and a sidewall member in accordance with aspects disclosed herein.

FIG. 6 illustrates another embodiment of a connection between top member 18 and sidewall member 120 wherein top member 18 does not extend around the sidewalls and top member is welded to sidewall member 120 with a full penetration weld 46. In this embodiment, an optional plate (not shown) may be positioned on an opposite side of the weld to reduce any sputtering of weld material within the tank.

The embodiments of FIGS. 4-6 are for purposes of example only with other connections also being envisioned. For example, top member 18 need not necessarily have extending surfaces 26. In one embodiment (not shown), for example a flange extends from top member 18 to facilitate the connection. Additionally, any of the above embodiments may be applicable to the connection between bottom member 122 and sidewall members 120 with several additional examples being discussed with respect to FIGS. 7 and 8.

Figure 7:
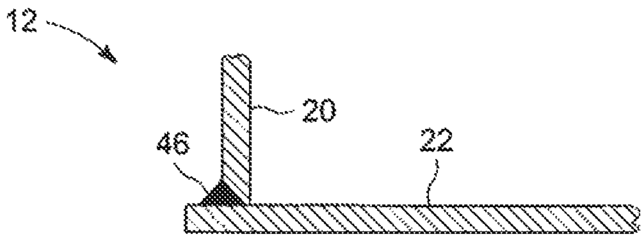
FIG. 7 illustrates an embodiment of a connection between a bottom member and a sidewall member in accordance with aspects disclosed herein.
Figure 8:
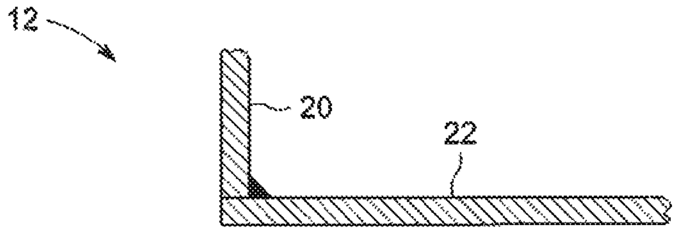
FIG. 8 illustrates another embodiment of a connection between a bottom member and a sidewall member in accordance with aspects disclosed herein.

FIG. 7 illustrates an embodiment of a connection between bottom member 122 and a sidewall member 120 wherein bottom member 122 extends beyond sidewall member 120. In this embodiment sidewall member 120 includes a bevel facing away from the tank, and the joint between the bottom member and the sidewall member comprises a full penetration weld 46. Welding is performed from exterior of tank 12. In another embodiment as shown in FIG. 8, welding is performed from interior of tank 12. The above embodiments of FIGS. 7 and 8 may be applicable to the connection between top and sidewall members.

The connections as described referring to FIGS. 4-8 enable the top member 18 and the sidewall members 120 to flex outward to increase inner volume of the tank 12 under increased pressure conditions while retaining the connection.

Figure 9:
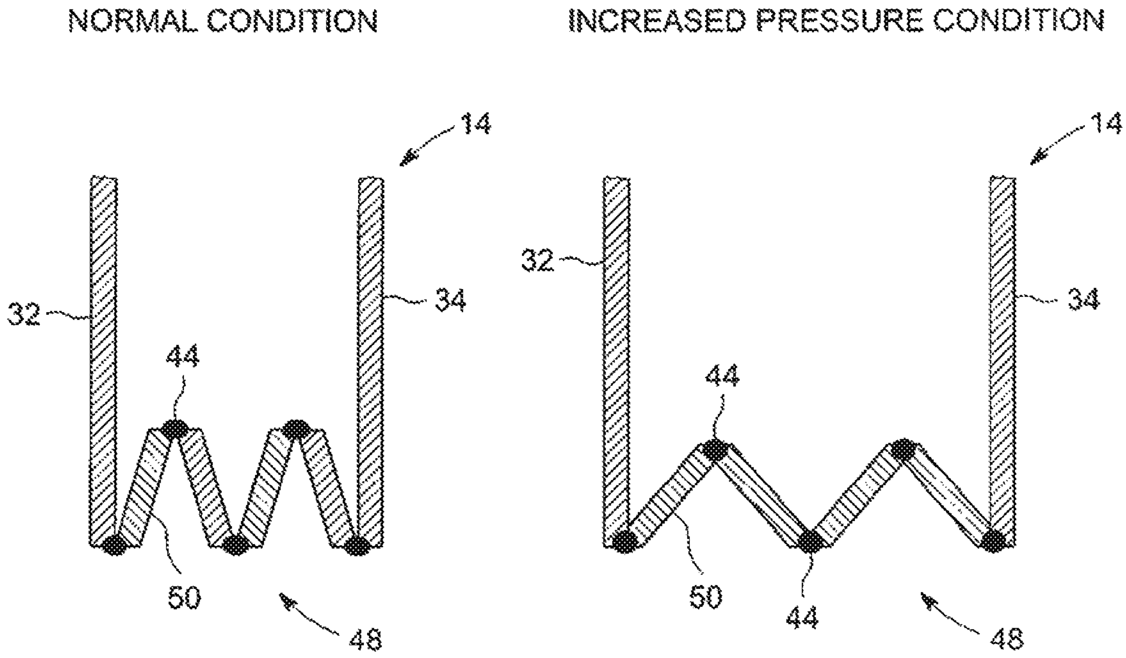
FIG. 9 illustrates an embodiment of a circumferential joint of a radiator in accordance with aspects disclosed herein.

FIG. 9 illustrates an embodiment of a circumferential joint connection 48 connecting inner panel 32 and outer panel 34 of radiator 14. Circumferential joint 48 comprises a series of interconnecting members 50 connected to the inner and outer panels by weld joints 44. Interconnecting members 50 are connected in an inclined relationship by weld joints 44. Under increased pressure conditions, interconnecting members 50 tend to spread outward. The inner panel and the outer panel also flex outward, thereby creating additional volume in the radiator.

Figure 10:
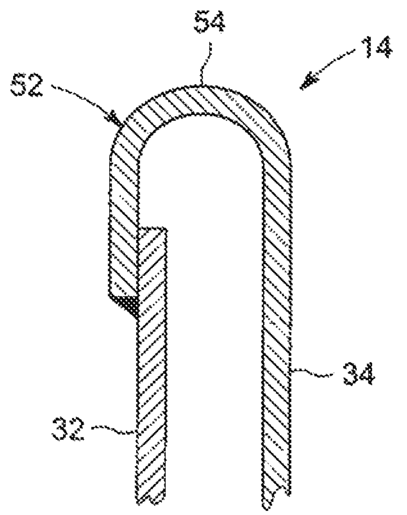
FIG. 10 illustrates another embodiment of a circumferential joint of a radiator in accordance with aspects disclosed herein.

FIG. 10 illustrates another embodiment of a circumferential joint 52 connection between inner panel 32 and outer panel 34 of radiator 14. Circumferential joint 52 comprises an overlapping portion 54 of outer panel 34 that is welded to inner panel 32.

Figure 11:
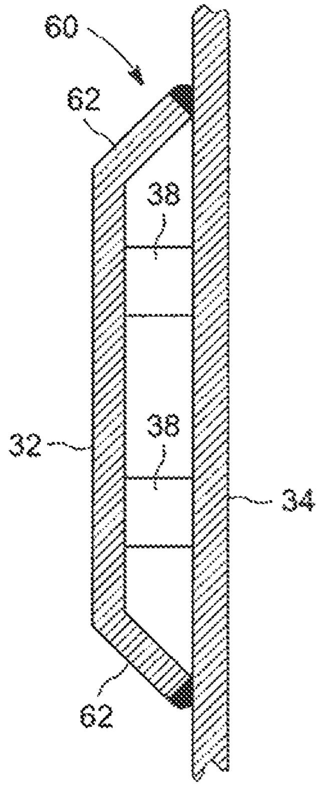
FIG. 11 illustrates another embodiment of a circumferential joint of a radiator in accordance with aspects disclosed herein.

FIG. 11 illustrates another embodiment of a circumferential joint 60 connection between inner panel 32 and outer panel 34 of radiator 14. Circumferential joint 60 comprises a bent portion 62 of inner panel 32 that is welded to outer panel 34. In one embodiment, a stronger weld is provided on topside of radiator and a weaker weld is provided on bottom side of radiator.

Figure 12:
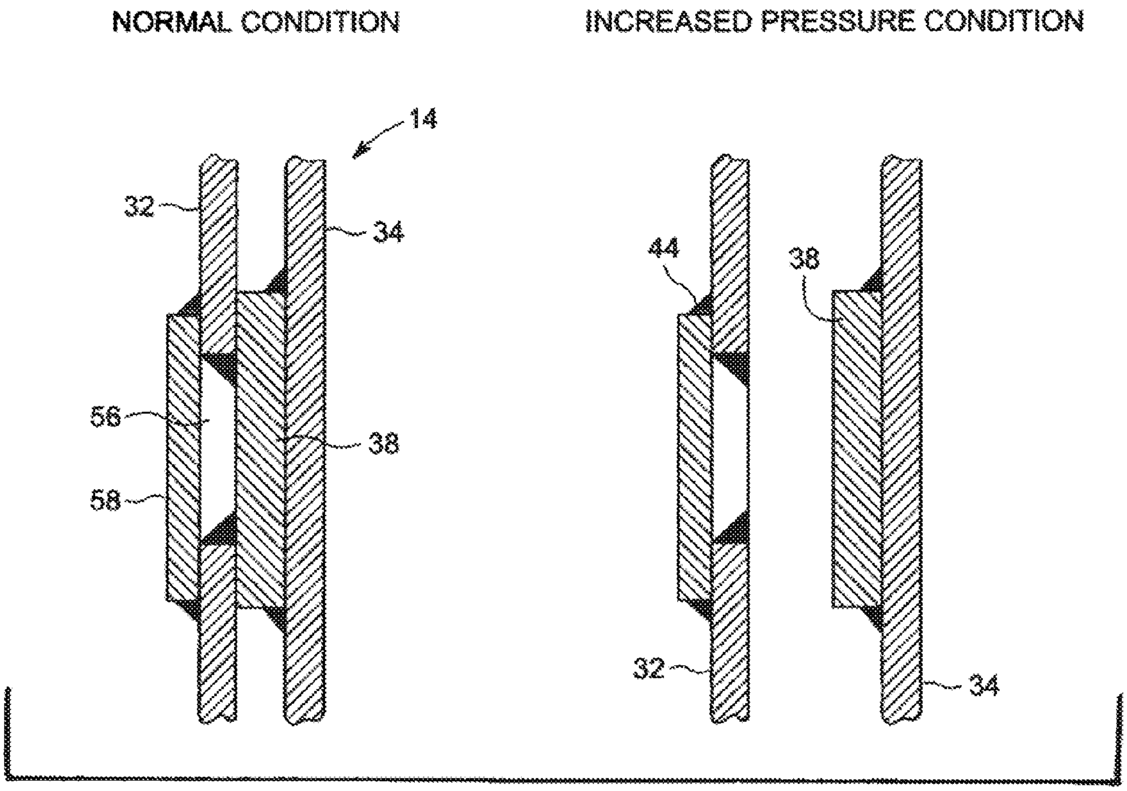
FIG. 12 illustrates an embodiment of a radiator in accordance with aspects disclosed herein.

FIG. 12 illustrates another embodiment of radiator 14 wherein inner panel 32 comprises a hole 56 for each spacer 38 to be attached. The size of spacer 38 is greater than the size of hole 56. In one embodiment, spacer 38 is initially attached to an inner surface of outer panel 34. Inner panel 32 and outer panel 34 are then connected. In this embodiment, spacer 38 is attached at a location on outer panel 34 such that it overlaps the hole 56 in the inner panel 32. A cover member 58 is attached to the outer surface of inner panel 32 to cover the hole 56. In one embodiment, weld joints 44 are used for attaching spacer 38 and cover member 58. Spacer 38 is attached such that spacer 38 detaches from inner panel 32 under increased pressure conditions. Cover member 58 keeps radiator 14 in sealed condition after spacer 38 detaches from the inner panel 32. A single spacer and hole are shown as an example. The radiator can comprise multiple spacers and holes for each spacer.

Figure 13:
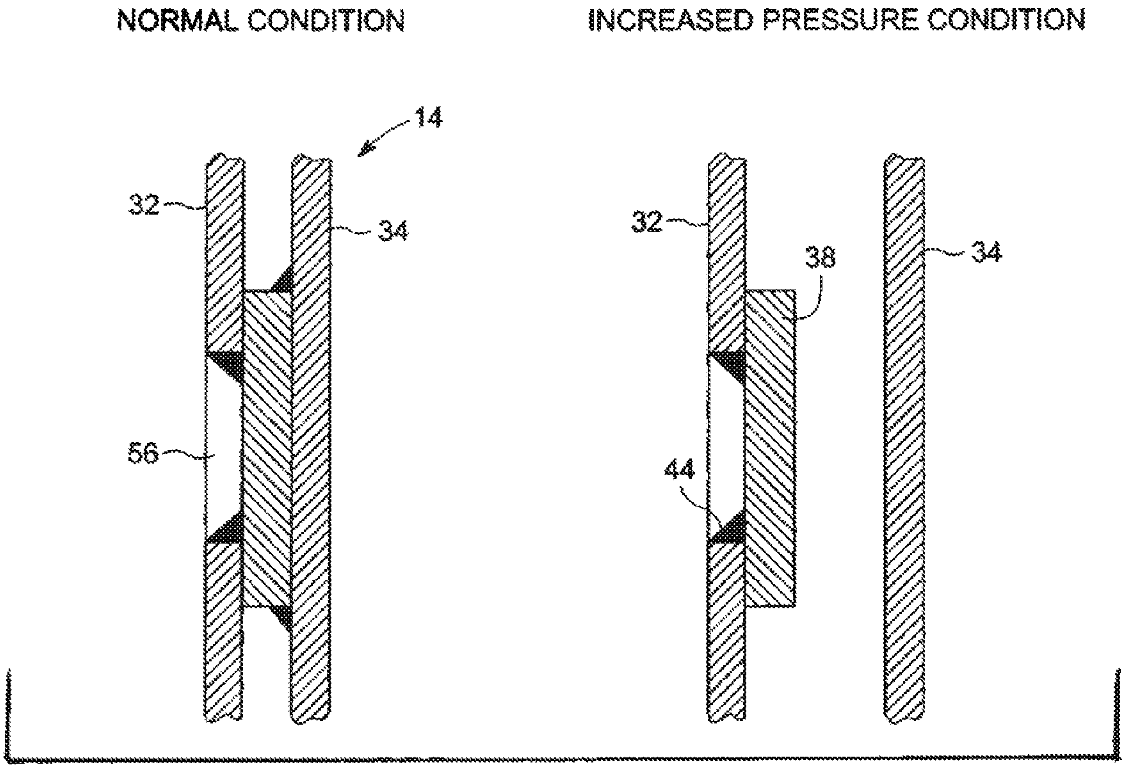
FIG. 13 illustrates another embodiment of a radiator in accordance with aspects disclosed herein.

In another embodiment as shown in FIG. 13, a cover member is not provided. In this embodiment, spacer 38 is attached in a manner so that that spacer 38 detaches from the outer panel 34 under increased pressure conditions. Therefore, spacer 38 keeps radiator 14 in sealed condition after detaching from outer panel 34.

Figure 14:
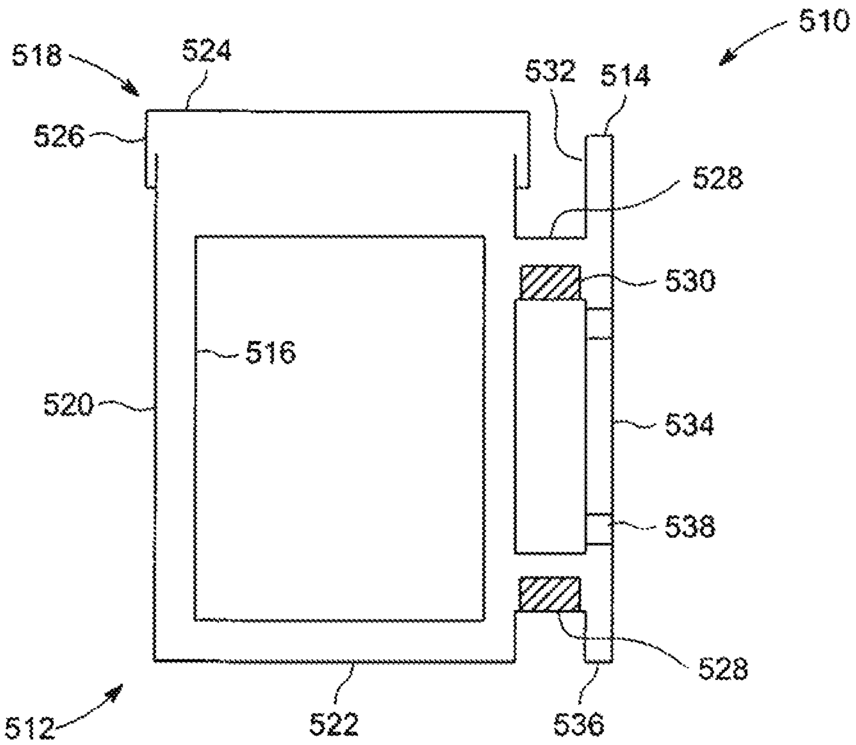
FIG. 14 illustrates an embodiment of a transformer system under normal operating conditions in accordance with aspects disclosed herein.

FIG. 14 illustrates an embodiment of a rupture resistant system 510 comprising a tank 512, a radiator 514, and a component 516 situated within tank 512. Component 516 is susceptible to creating increasing pressure within tank 512 when under a fault condition. In one embodiment, component 516 comprises a transformer coil and core assembly with accessories, and the tank comprises a transformer tank. Tank 512 comprises a top member 518, a sidewall member 520, and a bottom member 522. In one embodiment, top member 518 comprises a curved member having a top plate 524 and surfaces 526 extending perpendicularly from the top plate and over a portion of sidewall members 520, and top member 518 and sidewall members 520 are coupled by a joint comprising a flange extending from the sidewalls and at least one weld. Top member 518, bottom member 522, or both may be connected to sidewall member 520 using joints designed to facilitate top member 518 and sidewall members 520 to flex outward to increase inner volume of tank 512 while remaining connected under increased pressure conditions.

Radiator 514 may be connected to tank 512 by header pipes 528. Header pipes 528 have diameters that are larger than conventional header pipe diameters and are sized to permit sufficient flow of gas from the transformer tank to the radiator under increased pressure conditions. Under normal operating conditions, increased header pipe diameters may reduce thermal performance. In one embodiment, header pipes 528 are provided with flow restrictors 530 to control flow from tank 512 to radiator 514. Flow restrictors 530 are configured to be displaced under increased pressure conditions to increase flow from tank 512 to radiator 514. In one example, the header pipes have diameters ranging from six inches to ten inches and having cross sections of four inches when flow restrictors 530 are in place to control flow. In another embodiment, the sum of the cross-sectional areas of the header pipes is adjusted by additionally or alternatively adjusting a number of header pipes. Flow restrictors may optionally be used in this embodiment as well.

Radiator 514 comprises an inner panel 532 and an outer panel 534 connected to the inner panel with inner panel 532 being coupled to header pipes 528. Inner panel 532 and outer panel 534 flex outward to increase inner volume of radiator 514 under increased pressure conditions. In one embodiment, inner panel 532 and outer panel 534 are connected by a circumferential joint 536 that is strong enough to retain connection between the inner and outer panel when the inner panel 532 and the outer panel 534 flex outward. The circumferential joint 536 comprises a joint connecting the peripheries of the inner and outer panels. Spacers 538 may be attached between the inner and outer panels to maintain inner panel 532 and outer panel 534 in a spaced apart relationship.

Figure 15:
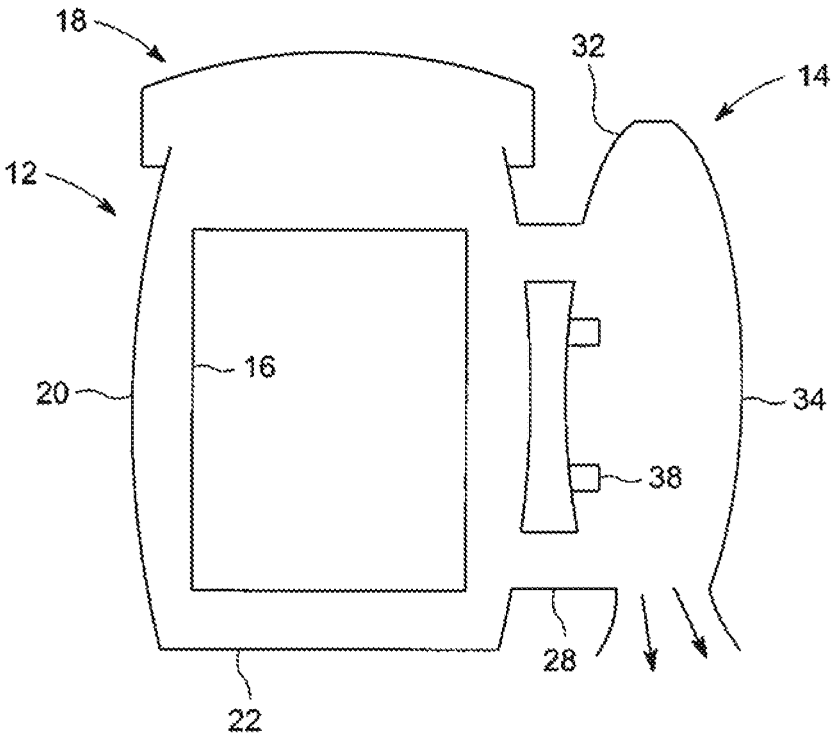
FIG. 15 illustrates an embodiment of the transformer system, as embodied by the invention, venting pressure under excessive pressure conditions in accordance with aspects disclosed herein.

FIG. 15 illustrates the rupture resistant system under increased pressure conditions. Top member 518 and sidewall members 520 flex outward to create additional volume under increased pressure conditions. Similarly, inner panel 532 and outer panel 534 of radiator 514 also flex outward to create additional volume. The flow restrictors (not shown) are displaced from header pipes 528. As inner panel 532 and outer panel 534 flex outward, spacers 538 are detached from one of the panels (shown as outer panel 534). The additional volume thus created increases the amount of gas that the tank 512 and radiator 514 can withstand without rupturing.

Figure 16:
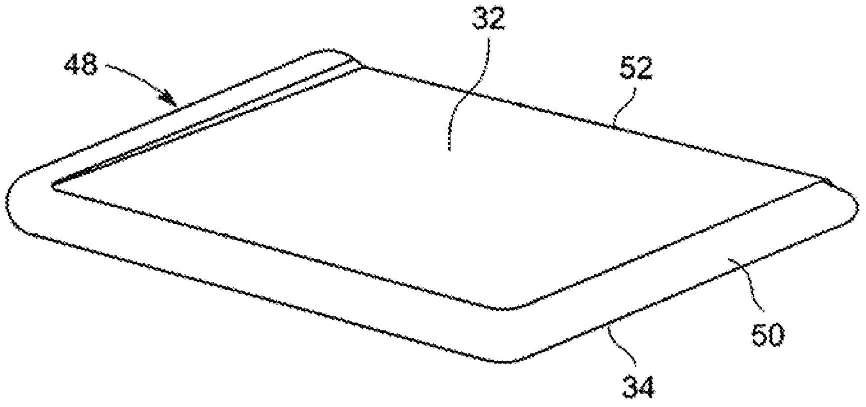
FIG. 16 illustrates an embodiment of a circumferential joint of a radiator, as embodied by the invention.

FIG. 16 illustrates an embodiment of a circumferential joint connection 48 connecting inner panel 32 and outer panel 34 of radiator 14. Circumferential joint 48 comprises a series of interconnecting members 50 connected to the inner and outer panels by weld joints 44. Interconnecting members 50 are connected in an inclined relationship by weld joints 44. Under increased pressure conditions, interconnecting members 50 tend to spread outward. The inner panel and the outer panel also flex outward, thereby creating additional volume in the radiator.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A rupture resistant system, comprising:

a tank comprising:

a combined body member, comprising:

a curved sidewall that curves between a first axial end and a second axial end;

a curved bottom wall, wherein the curved sidewall and the curved bottom wall curve toward each other and define a partially curved interior in at least a portion of the tank;

a single piece top member, wherein the single-piece top member comprises a curved member having a vertical extending surface, and the vertical extending surface has an inner portion that extends over a vertical exterior portion of the curved sidewall; and a component situated with in the tank and susceptible to creating increasing pressure within the tank when under a fault condition, wherein at least one of the single-piece top member, the curved sidewall, or the curved bottom wall is connected to another of the single-piece top member, the curved sidewall, or the curved bottom wall so as to cause an increase of an inner volume of the tank under increased pressure conditions.

2. The system of claim 1, wherein the component is a transformer.

3. The system of claim 2, further comprising a radiator coupled to the tank, and wherein the radiator is configured to increase in inner volume under increased pressure conditions.

4. The system of claim 2, wherein the single-piece top member, the curved bottom wall, or both are connected to the curved sidewall using at least one joint that facilitates the single-piece top member and the curved sidewall to flex outward to increase the inner volume of the tank while remaining connected.

5. The system of claim 4, wherein the joint comprises a flange extending from the curved sidewall and at least one weld.

6. The system of claim 4, wherein the curved bottom wall extends beyond the curved sidewall, the curved sidewall includes a bevel facing away from the tank, and the at least one joint between the bottom member and the sidewall member comprises a full penetration weld.

7. The system of claim 2, comprising at least one support beam coupled to the bottom member to reduce bending of the bottom member under increased pressure conditions.

8. The system of claim 3, wherein the radiator comprises at least one curved non-linear surface to define a partially curved interior in at least a portion of the radiator.

9. The system of claim 1, wherein the curved sidewall curves continuously about an axis.

10. A rupture resistant system, comprising:

a tank, comprising:

a combined body member, the combined body member forming a sidewall and a bottom wall of the tank connected with each other;

a single-piece top member comprising a curved member and a vertical extending surface, wherein the curved member has a radius of curvature and the vertical extending surface has an inner portion that extends over a vertical exterior portion of the sidewall, wherein at least one of the single-piece top member or the bottom wall is flexibly connected with the sidewall;

a radiator, wherein the radiator comprises at least one curved non-linear surface to define a partially curved interior in at least a portion of the radiator;

an inlet header pipe and an outlet header pipe that connect the tank to the radiator; and a component situated within the tank and susceptible to creating increasing pressure within system when under a fault condition and the single-piece top member and the sidewall flex outwardly while remaining connected thereby increasing an inner volume of the tank under the increasing pressure;

wherein the radiator is configured to increase in inner volume under increased pressure conditions.

11. The system of claim 10, wherein the radiator comprises an inner panel connected to an outer panel such that the inner panel and the outer panel flex outward to increase the inner volume of the radiator under increased pressure conditions.

12. The system of claim 11, wherein a spacer is attached to the inner panel and the outer panel.

13. The system of claim 12, wherein the spacer is configured to detach from the inner panel or the outer panel under increased pressure conditions.

14. The system of claim 13, wherein a cover member is provided to keep the radiator in a sealed condition after the spacer detaches from inner panel or the outer panel.

15. The system of claim 11, the inner panel and the outer panel are connected by a circumferential joint.

16. The system of claim 10, wherein the sidewall and the bottom wall comprise curved walls that curve toward each other.

17. A system, comprising:

a rupture resistant system, comprising:

a first enclosure, comprising:

a first sidewall extending around a first axis of a first chamber, wherein the first sidewall continuously curves about the axis;

a first axial end having a first opening into the first chamber;

a second axial end opposite the first axial end, wherein the second axial end has a first end wall that closes the first chamber, and the first enclosure has a first curvature in the first sidewall that extends to the first end wall; and a cover member disposed over the first opening and comprising vertical extending surface having an inner portion that extends over a vertical exterior portion of the first sidewall, wherein at least the cover member or the first end wall is flexibly connected with the first sidewall, and the cover member and the first sidewall flex outwardly while remaining connected thereby increasing an inner volume of the first enclosure.

18. The system of claim 17, comprising a transformer disposed in the first enclosure.

19. The system of claim 18, comprising a second enclosure, wherein the second enclosure is a radiator.

* * * * *